(12) United States Patent  
Poon

(10) Patent No.: US 6,791,669 B2  
(45) Date of Patent: Sep. 14, 2004

(54) POSITIONING DEVICE AND EXPOSURE APPARATUS INCLUDING THE SAME

(75) Inventor: Alex Ka Tim Poon, San Ramon, CA (US)

(73) Assignee: Nikon Corporation, Tokyo (JP)

( * ) Notice: Subject to any disclaimer, the term of this patent is extended or adjusted under 35 U.S.C. 154(b) by 293 days.

(21) Appl. No.: 09/832,990

(22) Filed: Apr. 12, 2001

(65) Prior Publication Data

US 2002/0149758 A1 Oct. 17, 2002

(51) Int. Cl.$^7$ .................. G03B 27/58; G03B 27/42; G03B 27/62
(52) U.S. Cl. ................. 355/72; 355/53; 355/76
(58) Field of Search ................. 355/53, 72–76; 310/10, 12; 378/34, 35; 318/625, 632

(56) References Cited

U.S. PATENT DOCUMENTS

| | | |
|---|---|---|
| 4,198,159 A | 4/1980 | Cachon |
| 4,525,852 A | 7/1985 | Rosenberg |
| 4,532,426 A | 7/1985 | Reeds |
| 4,694,477 A | 9/1987 | Siddall |
| 4,891,526 A | 1/1990 | Reeds |
| 5,566,584 A | 10/1996 | Briganti |
| 5,903,085 A | 5/1999 | Karam |
| 5,991,005 A * | 11/1999 | Horikawa et al. ............ 355/53 |
| 6,029,959 A * | 2/2000 | Gran et al. ................. 267/136 |
| 6,355,994 B1 * | 3/2002 | Andeen et al. .............. 310/15 |
| 6,453,566 B1 * | 9/2002 | Bottinelli et al. ............. 33/1 |

OTHER PUBLICATIONS

Kazuya Okamoto et al., "High–Throughput E–Beam Stepper Lithography," Solid State Technology, pp. 118–122 (2000).

\* cited by examiner

Primary Examiner—Henry Hung Nguyen
(74) Attorney, Agent, or Firm—Finnegan, Henderson, Farabow, Garrett & Dunner, L.L.P.

(57) ABSTRACT

A positioning device for positioning a wafer table and an exposure apparatus including the positioning device are disclosed. The positioning device includes a housing, a piezoelectric actuator, and a structure for moving the wafer table in a second direction. The piezoelectric actuator has a first and second end. The first end is fixedly mounted to the housing and the second end is movable in a first direction in response to a change in voltage applied to the piezoelectric actuator. The structure includes a first joint, a second joint, a diagonal member, and a flexure. The first joint is movable in the first direction in response to the second end of the piezoelectric actuator moving in the first direction. The second joint is movable in the second direction to move the wafer in the second direction. The diagonal member is connected to the first and second joints at an angle with respect to the first direction. The flexure connects the diagonal member to the first joint and is bendable in response to the first joint moving in the first direction to change the angle with respect to the first direction and thereby move the second joint in the second direction.

14 Claims, 19 Drawing Sheets

US 6,791,669 B2

POSITIONING DEVICE AND EXPOSURE APPARATUS INCLUDING THE SAME

BACKGROUND OF THE INVENTION

The present invention relates generally to positioning devices. More particularly, the present invention relates to a positioning device for controlling the position of a wafer table and an exposure apparatus, including the positioning device, for manufacturing semiconductor wafers.

In an exposure apparatus, a wafer table holds a semiconductor wafer to be exposed. To compensate for the variations in the dimensions of the wafer (e.g., wafer thickness), the exposure apparatus controls and adjusts the position of the wafer table before the wafer is exposed. Conventionally, piezoelectric actuators are used to control the position of the wafer table.

A piezoelectric actuator, however, typically has a limited stroke. One way to solve this problem is to use a cantilever type mechanism in conjunction with a piezoelectric actuator. Thus, for a piezoelectric actuator of a given length, a cantilever type mechanism amplifies the stroke provided by the piezoelectric actuator.

A cantilever type mechanism, however, amplifies the stroke of a piezoelectric actuator at the expense of decreased stiffness. Thus, a cantilever type mechanism used in conjunction with a piezoelectric actuator responds slower to a given servo bandwidth than a piezoelectric actuator alone. Thus, as the stiffness decreases, more time is needed to control the position of a wafer table. This increase in time needed to control the position of a wafer table may lead to a decrease in the production rate of wafers.

In light of the foregoing, there is a need for a structure that amplifies the stroke of a piezoelectric actuator without unduly deceasing its stiffness.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, the invention is directed to an exposure apparatus for exposing a pattern onto a semiconductor wafer. The exposure apparatus comprises an illumination system, a lens assembly, and a positioning device. The illumination system has an illumination source emitting a beam and an illumination optical assembly guiding the beam onto the pattern. The lens assembly projects the beam passed through the pattern onto the wafer held by a wafer table. The positioning device comprises a housing, a piezoelectric actuator, and a structure for moving the wafer table in a second direction. The piezoelectric actuator has a first and second end. The first end is fixedly mounted to the housing and the second end is movable in a first direction in response to a change in voltage applied to the piezoelectric actuator. The structure comprises a first joint, a second joint, a diagonal member, and a flexure. The first joint is movable in the first direction in response to the second end of the piezoelectric actuator moving in the first direction. The second joint is movable in the second direction to move the wafer table in the second direction. The diagonal member is connected to the first and second joints at an angle with respect to the first direction. The flexure connects the diagonal member to the first joint and is bendable in response to the first joint moving in the first direction to change the angle with respect to the first direction and thereby move the second joint in the second direction.

In another aspect, the present invention concerns a device for positioning a wafer table. The device comprises a housing, a piezoelectric actuator, and a structure for moving the wafer table in a second direction. The piezoelectric actuator has a first and second end. The first end is fixedly mounted to the housing and the second end is movable in a first direction in response to a change in voltage applied to the piezoelectric actuator. The structure comprises a first joint, a second joint, a diagonal member, and a flexure. The first joint is movable in the first direction in response to the second end of the piezoelectric actuator moving in the first direction. The second joint is movable in the second direction to move the wafer table in the second direction. The diagonal member is connected to the first and second joints at an angle with respect to the first direction. The flexure connects the diagonal member to the first joint and is bendable in response to the first joint moving in the first direction to change the angle with respect to the first direction and thereby move the second joint in the second direction.

A still further aspect of the present invention is a structure for moving a wafer table comprising a first joint, a second joint, a diagonal member, and a flexure. The first joint is movable in a first direction. The second joint is movable in a second direction to move the wafer table in the second direction. The diagonal member is connected to the first and second joints at an angle with respect to the first direction. The flexure connects the diagonal member to the first joint and is bendable in response to the first joint moving in the first direction to change the angle with respect to the first direction and thereby move the second joint in the second direction.

It is to be understood that both the foregoing general description and the following detailed description are exemplary and explanatory only and are not restrictive of the invention, as claimed.

Additional advantages will be set forth in the description which follows, and in part will be understood from the description, or may be learned by practice of the invention. The objects and advantages may be obtained by means of the combinations set forth in the attached claims.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

FIG. 5 shows only those movements resulting from an increase in the angle α between first diagonal members and +x direction;

FIG. 6 shows only those movements resulting from a decrease in the angle α between first diagonal members and +x direction;

FIG. 7 shows only those movements resulting from an increase in the angle β between second diagonal members and +x direction;

FIG. 8 shows only those movements resulting from a decrease in the angle β between second diagonal members and +x direction;

FIG. 9 combines FIGS. 5 and 7 and shows the overall movements of the first and second joints resulting from increases in the angles α and β;

FIG. 10 combines FIGS. 6 and 8 and shows the overall movements of the first and second joints resulting from decreases in the angles α and β;

DETAILED DESCRIPTION

Reference will now be made in detail to the presently preferred embodiment of the present invention, examples of which are illustrated in the accompanying drawings. Wherever possible, the same reference numbers will be used throughout the drawings to refer to the same or like parts.

For the purpose of the following description, unless stated otherwise, the coordinate system illustrated in each figure is arbitrary and applies in that figure only. Also, unless stated otherwise, a direction refers to either a positive or negative vector of that direction. For example, unless specifically stated as +x direction or −x direction, x direction refers to either +x or −x direction. Also, ±direction refers to either a positive or negative vector of that direction. For example, ±x refers to either +x or −x direction. Moreover, unless stated otherwise, a rotation around an axis refers to either a clockwise or counterclockwise rotation around the axis. For example, a rotation around an x-axis refers to either a clockwise or counterclockwise rotation around the x-axis.

In accordance with the invention, an exposure apparatus is provided for exposing a pattern onto a semiconductor wafer. The exposure apparatus comprises an illumination system and a lens assembly. The illumination system has an illumination source emitting a beam and an illumination optical assembly guiding the beam onto the pattern. The lens assembly projects the beam passed through the pattern onto the wafer held by a wafer table.

Figure 1:
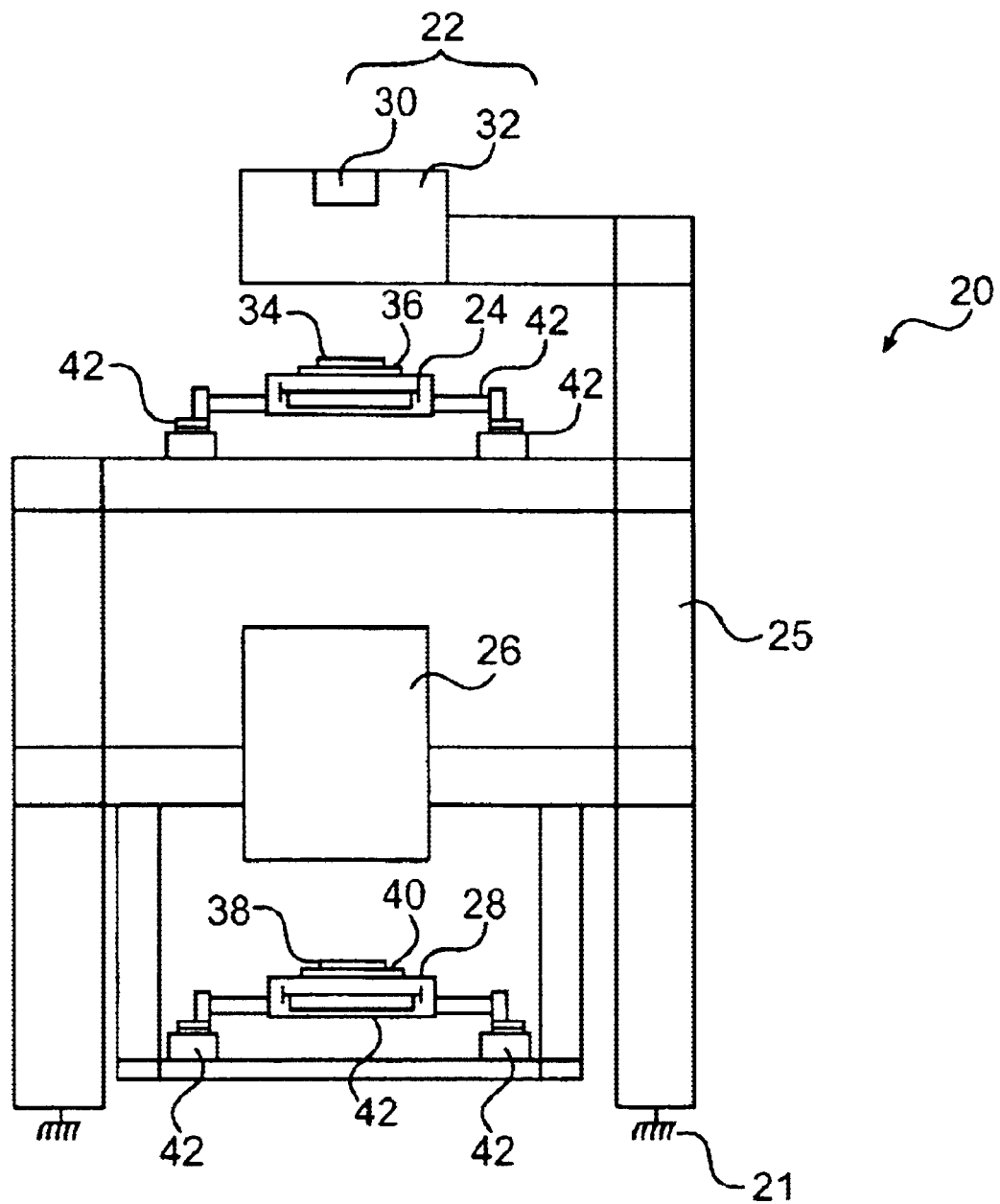
FIG. 1 is an elevation view of an exposure apparatus having the features of the present invention.

In the embodiment shown in FIG. 1, an exposure apparatus for manufacturing semiconductor wafers is designated generally by reference number 20. As shown in FIG. 1, exposure apparatus 20 includes an illumination system 22, a reticle stage 24, a lens assembly 26, and a wafer stage 28. Illumination system 22 includes an illumination source 30 emitting a beam and an illumination optical assembly 32 guiding the beam onto a reticle 34 containing a pattern of an integrated circuit to be transferred to a wafer 38. Lens assembly 26 projects the beam passed through reticle 34 onto wafer 38. Exposure apparatus 20 is designed to be mounted to a base 21, i.e., a floor or the ground or some other supporting structure.

Exposure apparatus 20 further includes a wafer table 40 and a reticle table 36 respectively holding wafer 38 and reticle 34. Wafer stage 28 supports and positions wafer table 40 with respect to lens assembly 26. Similarly, reticle stage 24 supports and positions reticle table 34 with respect to lens assembly 26. Although FIG. 1 shows reticle table 36, reticle 34 may be directly supported on reticle stage 24 without reticle table 36. In the embodiment illustrated in FIG. 1, a plurality of motors 42 move and position reticle stage 24 and wafer stage 28. Depending on the design, exposure apparatus 20 may also include additional servo drive units, linear motors, and planar motors to move reticle stage 24 and wafer stage 28.

An apparatus frame 25 is a rigid structure that supports the components of exposure apparatus 20, including reticle stage 24, wafer stage 28, lens assembly 26, and illumination system 22, above base 21. The design of apparatus frame 25 may vary to suit the design requirements for the rest of exposure apparatus 20. Alternatively, for example, separate, individual structures (not shown) can be used to support reticle stage 24, wafer stage 28, lens assembly 26, and illumination system 22 above base 21.

In accordance with the invention, the exposure apparatus further includes a positioning device. The positioning device comprises a housing, a piezoelectric actuator, and a structure for moving the wafer table in a second direction. The piezoelectric actuator has a first and second end. The first end is fixedly mounted to the housing and the second end is movable in a first direction in response to a change in voltage applied to the piezoelectric actuator.

Figure 2:
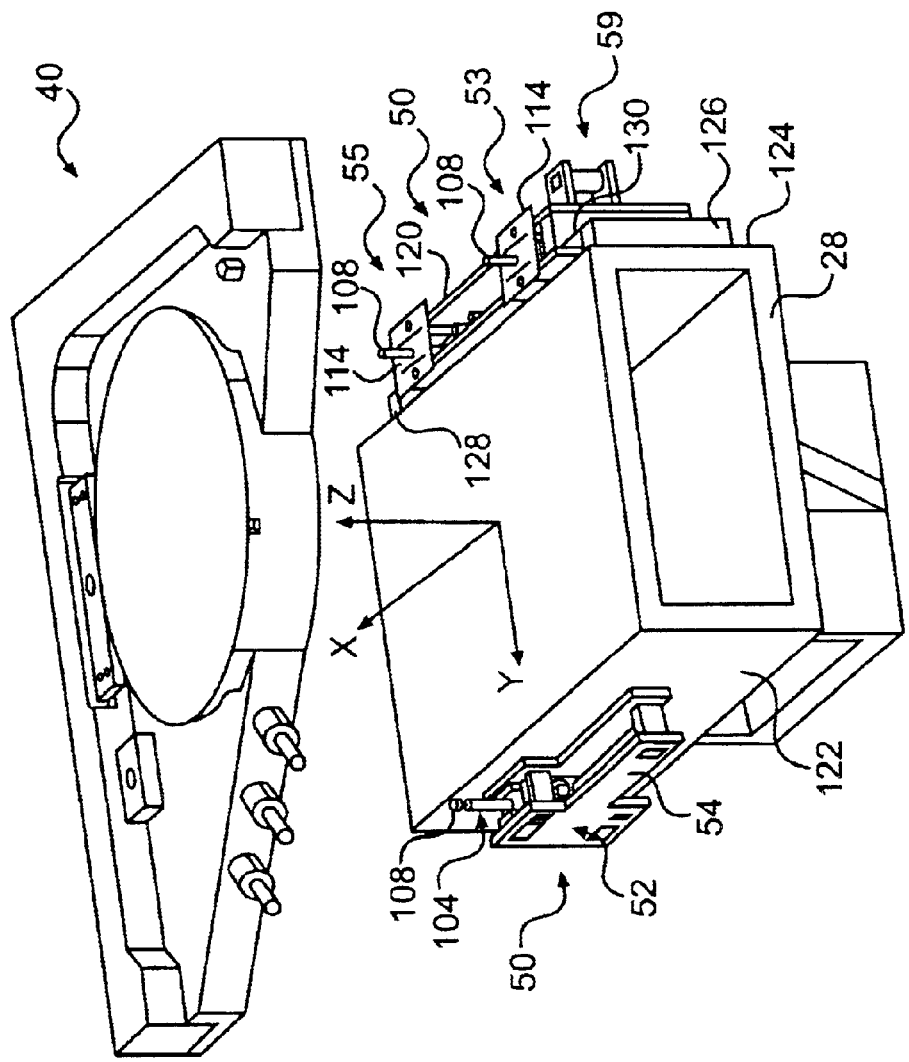
FIG. 2 is an exploded perspective view of a wafer stage and a wafer table shown in FIG. 1 in more detail.

In the embodiment shown in FIG. 2, exposure apparatus 20 includes one of more positioning devices 50 for controlling the position of wafer table 40. One of more positioning devices 50 are mounted to wafer stage 28 as shown in FIG. 2. Preferably, exposure apparatus 20 includes four positioning devices 52, 53, 55, and 59 to control the position of wafer table 40 in four degrees of freedom. As will be explained in greater detail below, in the coordinate system shown in FIG. 2, four positioning devices 52, 53, 55, and 59 cooperate to control the position of water table 40 in z direction as well as its rotation around x, y, and z axes. In addition, wafer table 40 is connected to first 52, second 53, and third 55 positioning devices so that motors 42 (FIG. 1), moving wafer stage 28 in x and y directions, controls the position of wafer table 40 in x and y directions. Accordingly, four positioning devices 52, 53, 55, and 59, in conjunction with wafer stage 28, control the position of wafer table 40 in six degrees of freedom.

Figure 3:
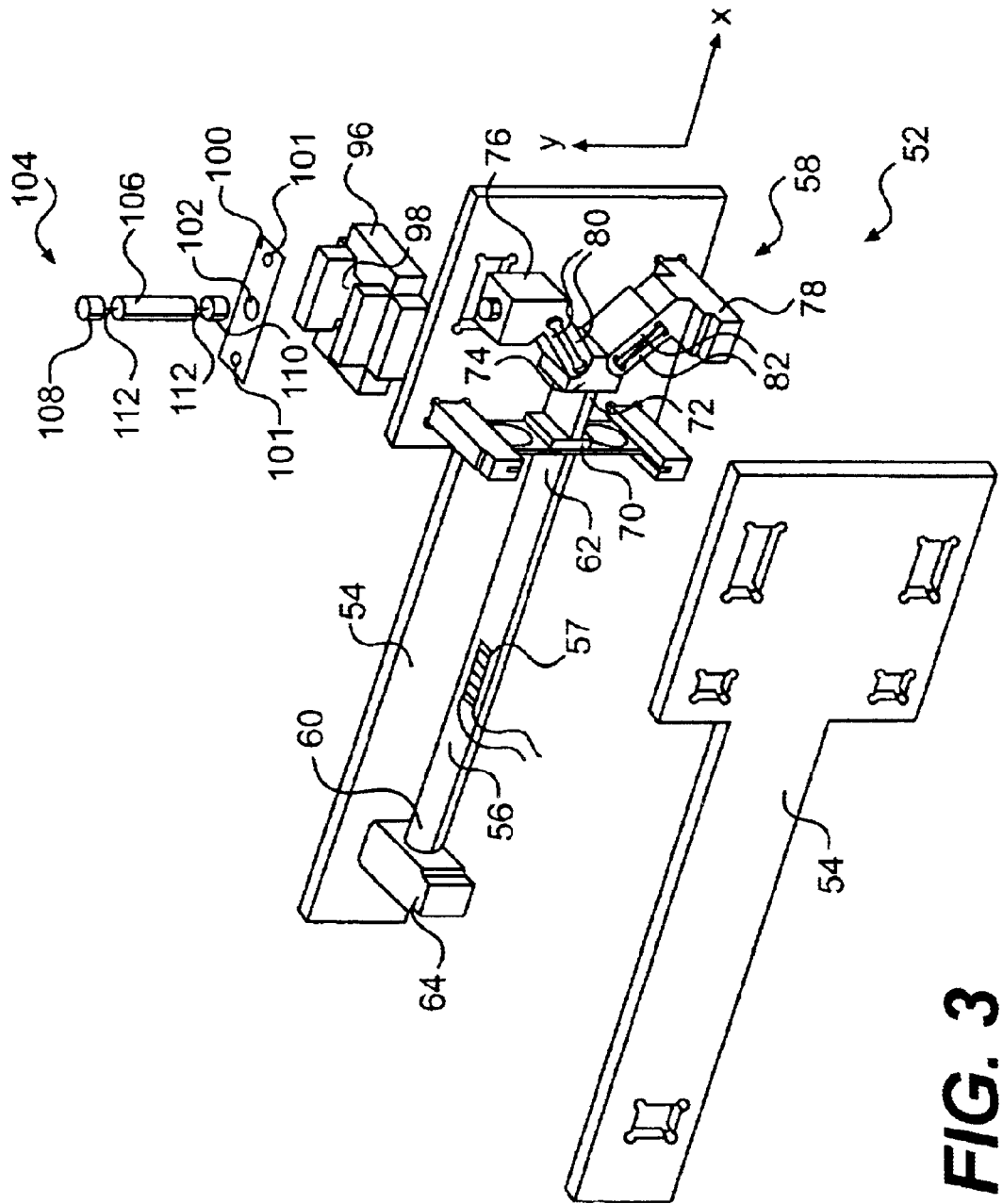
FIG. 3 is an exploded perspective view of a positioning device shown in FIG. 2 illustrating a force flexure and a piezoelectric actuator.

FIG. 3 is an exploded view of first positioning device 52 shown in FIG. 2. First positioning device 52 includes a housing 54, a piezoelectric actuator 56, and a force flexure 58. Piezoelectric actuator 56 has a first end 60 and a second end 62. First end 60 of piezoelectric actuator 56 is mounted to a mounting block 64, which is in turn fixedly mounted to housing 54. Thus, when piezoelectric actuator 56 expands or contracts in response to a change in voltage applied thereto, first end 60 remains stationary while second end 62 of piezoelectric actuator 56 moves in x direction (±x direction depending on whether piezoelectric actuator 56 expands or contracts). This movement in x direction is transmitted to force flexure 58. Force flexure 58 then converts the movement in x direction to a corresponding movement in y direction (±y direction depending on whether piezoelectric actuator 56 expands or contracts). Preferably, a strain gauge 57 applied to a surface of piezoelectric actuator 56 monitors the amount of expansion and contraction of piezoelectric actuator 56.

In accordance with the present invention, the structure for moving the wafer table in the second direction comprises a first joint, a second joint, a diagonal member, and a flexure. The first joint is movable in the first direction in response to the second end of the piezoelectric actuator moving in the first direction. The second joint is movable in the second direction to move the table in the second direction. The diagonal member is connected to the first and second joints at an angle with respect to the first direction. The flexure connects the diagonal member to the first joint and is bendable in response to the first joint moving in the first direction to change the angle with respect to the first direction and thereby move the second joint in the second direction.

Figure 4:
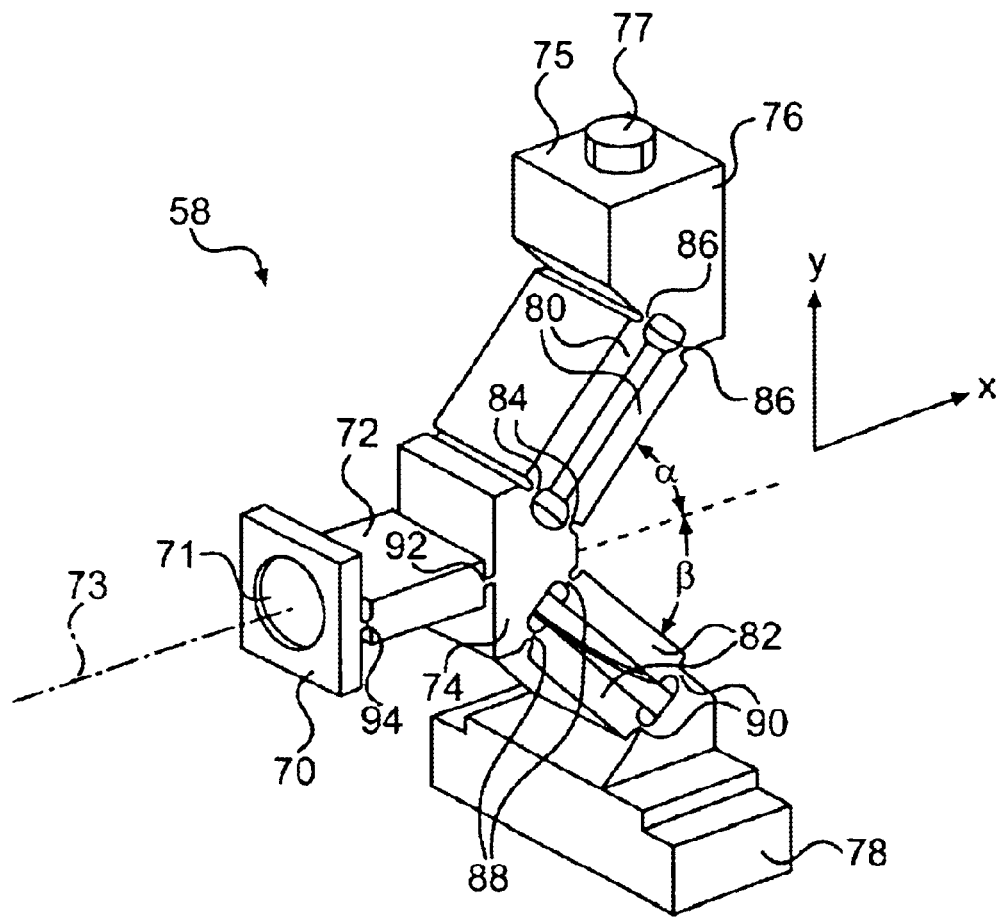
FIG. 4 is a perspective view of the force flexure shown in FIG. 3.

In the embodiment illustrated in FIGS. 3 and 4, force flexure 58 includes a flange 70 connected to second end 62 of piezoelectric actuator 56. A recess 71 formed in flange 70 holds second end 62 of piezoelectric actuator 56. Force flexure 58 further includes an axial member 72 connected to flange 70 and a first joint 74. Thus, flange 70 and axial member 72 transmits the movement of second end 62 of piezoelectric actuator 56 in x direction to first joint 74, which in turn is movable in x direction.

Figure 15:
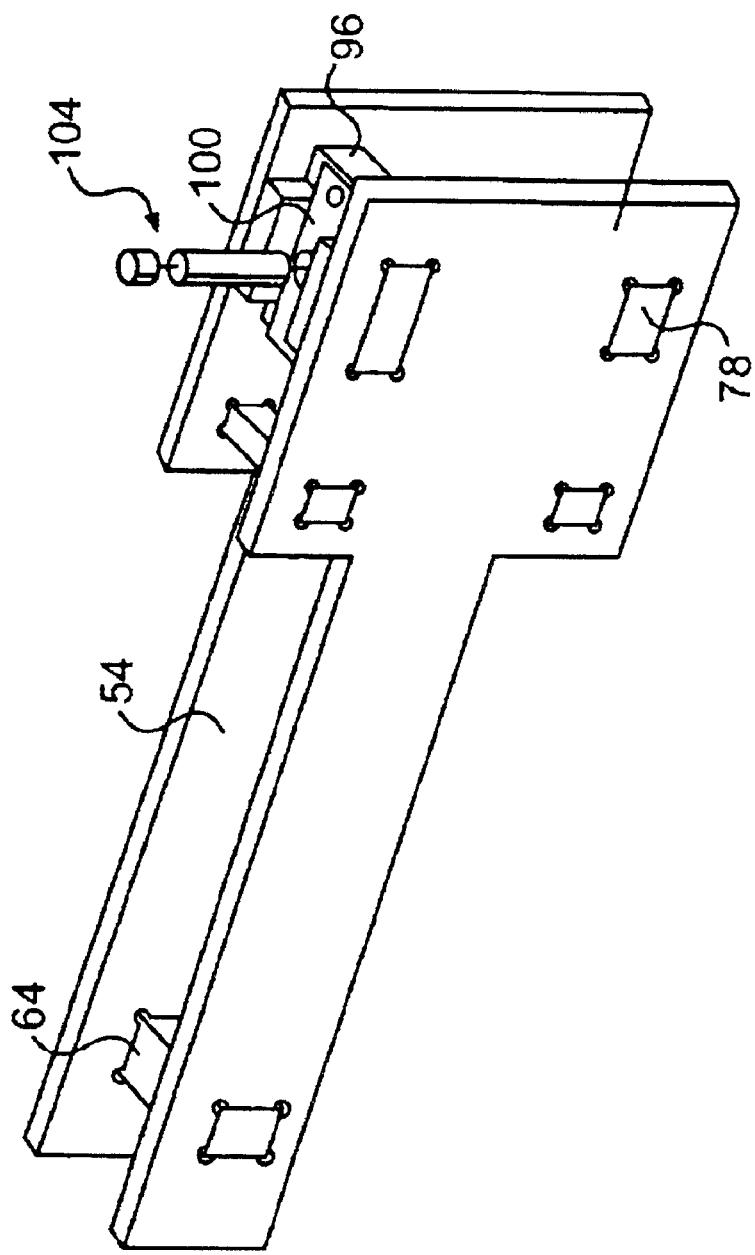
FIG. 15 is a perspective view of the positioning device shown in FIG. 3 in its assembled condition.

Force flexure 58 further includes a second joint 76. Second joint 76 moves in y direction through an opening 98 of a guide block 96 (FIG. 3). Guide block 96 is fixedly mounted to housing 54 as shown in FIG. 15. A pair of first diagonal members 80 are connected to first joint 74 and second joint 76 at an angle α with respect to +x direction. A pair of first flexures 84 connect corresponding first diagonal members 80 to first joint 74. Similarly, a pair of second flexures 86 connect corresponding first diagonal members 80 to second joint 76. First and second flexures 84 and 86 are bendable as first joint 74 moves in x direction.

Figure 5:
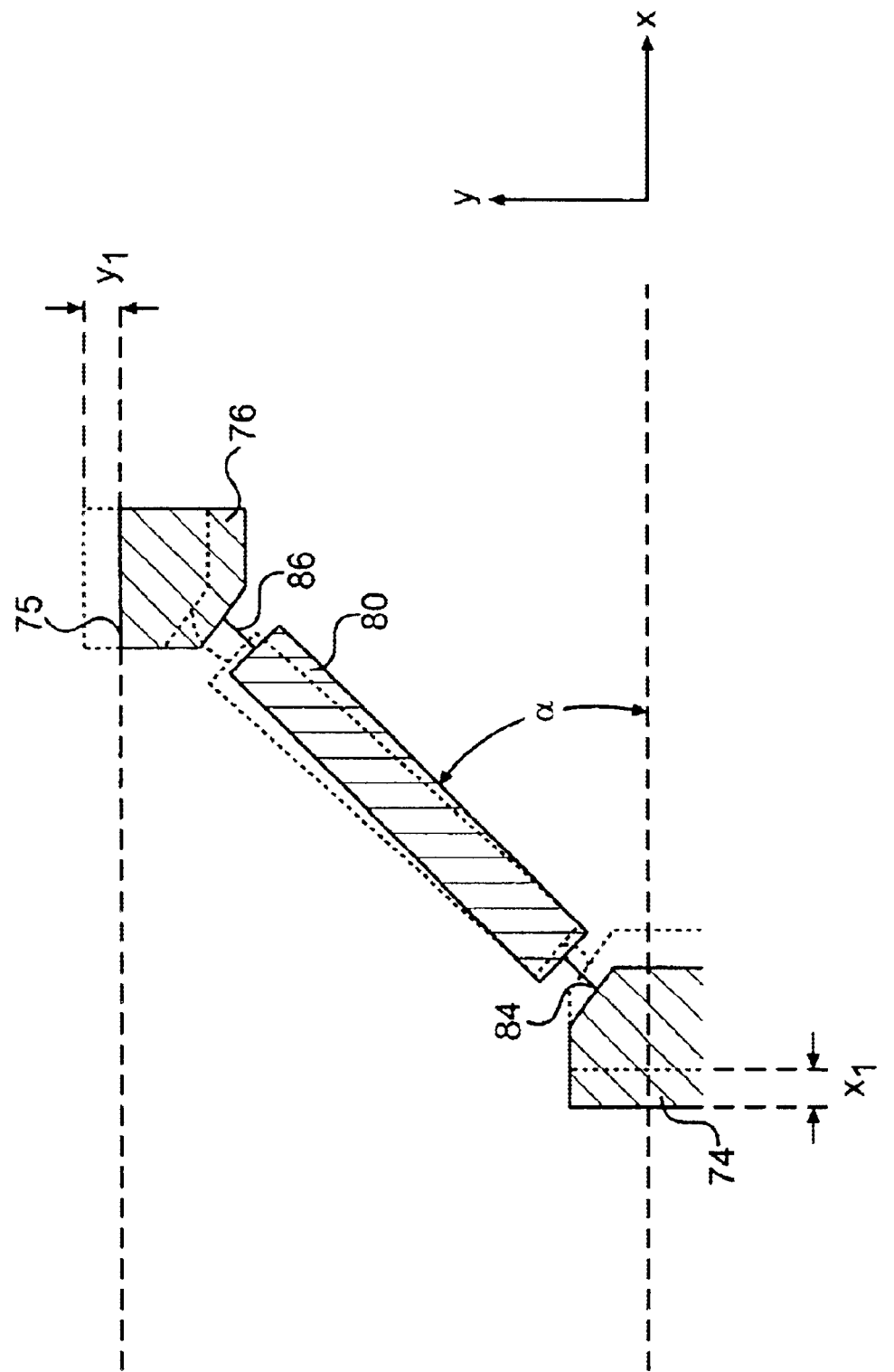
FIG. 5 is a schematic diagram illustrating the movements of a first and second joint in response to an expanding piezoelectric actuator.

As illustrated in FIG. 5, first joint 74 moving in +x direction pushes first diagonal members 80 in +x direction as piezoelectric actuator 56 expands. First diagonal members 80 as a whole, however, do not move in +x direction because guide block 96 (FIG. 15) limits the movement of second joint 76 in +x direction. Rather, first joint 74 moving in +x direction bends first flexures 84 to increase the angle α with respect to +x direction. As a result of this increase in the angle α with respect to +x direction, first diagonal members 80 push second joint 76 in +y direction and convert the movement of first joint 74 in +x direction by $x_1$ into the movement of second joint 76 in +y direction by $y_1$. In addition, second flexures 86 bend to maintain the top 75 of second joint 76 facing +y direction. FIG. 5 shows only a single first diagonal member 80, a single first flexure 84, and a single second flexure 86 to facilitate the understanding of the present invention. Also, FIG. 5 greatly exaggerates the length of first and second flexures 84 and 86 in order to show them bending in response to the movement of first joint 74 in +x direction.

Figure 6:
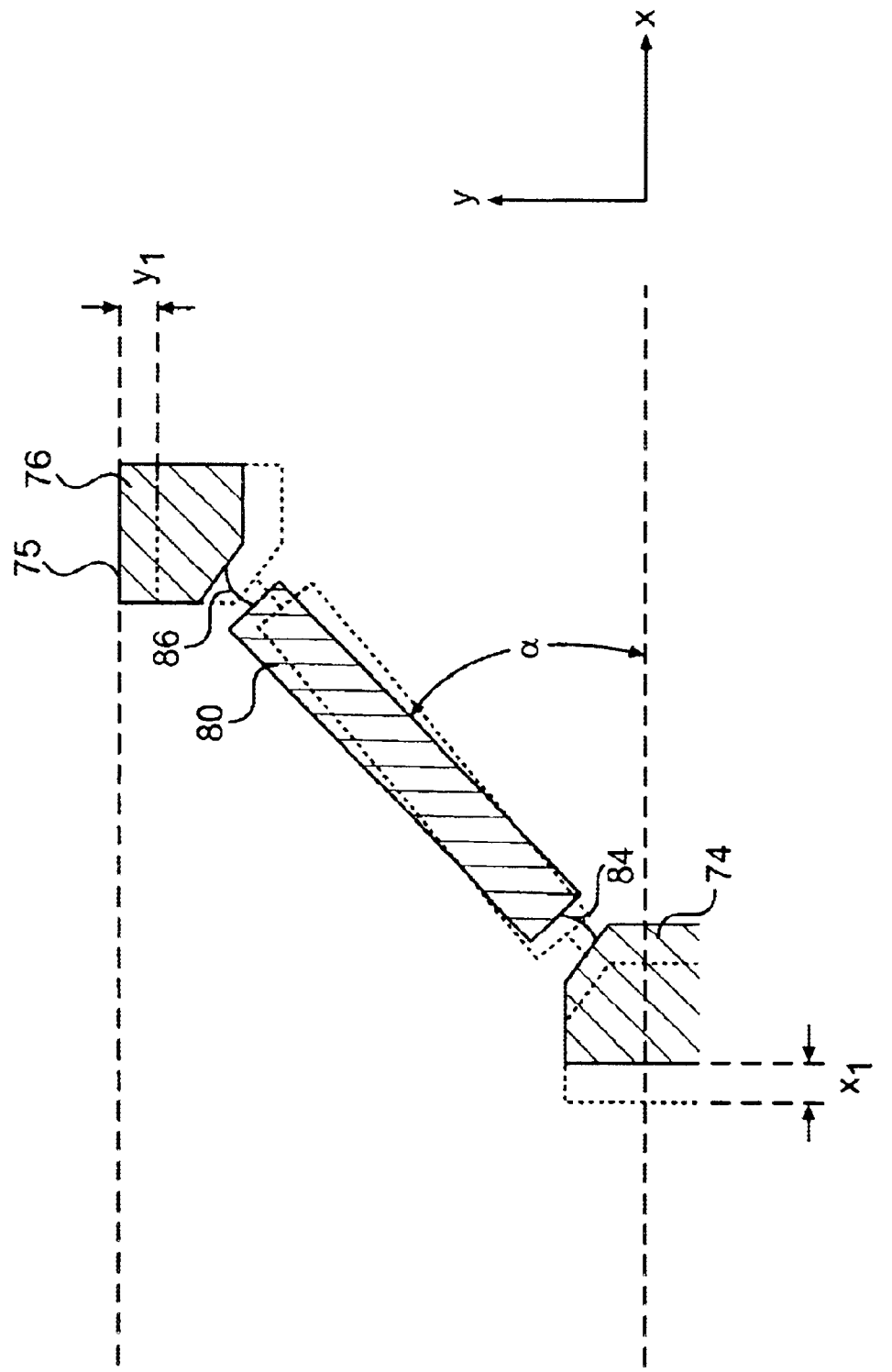
FIG. 6 is a schematic diagram illustrating the movements of a first and second joint in response to a contracting piezoelectric actuator.

Similarly, as illustrated in FIG. 6, first joint 74 moving in −x direction pulls first diagonal members 80 in −x direction as piezoelectric actuator 56 contracts. First diagonal members 80 as a whole, however, do not move in −x direction because guide block 96 (FIG. 15) limits the movement of second joint 76 in −x direction. Rather, first joint 74 moving in −x direction bends first flexures 84 to decrease the angle α with respect to +x direction. As a result of this decrease in the angle α with respect to +x direction, first diagonal members 80 pull second joint 76 in −y direction and convert the movement of first joint 74 in −x direction by $x_1$ into the movement of second joint 76 in −y direction by $y_1$. In addition, second flexures 86 bend to maintain the top 75 of second joint 76 facing +y direction. FIG. 6 shows only a single first diagonal member 80, a single first flexure 84, and a single second flexure 86 to facilitate the understanding of the present invention. Also, FIG. 6 greatly exaggerates the length of first and second flexures 84 and 86 in order to show them bending in response to the movement of first joint 74 in −x direction.

In accordance with the present invention, the force flexure further includes a base, a second diagonal member, a third flexure, and a fourth flexure. The base is fixedly mounted to the housing. The second diagonal member is connected to the first joint and the base at a second angle with respect to the first direction. The third flexure connects the second diagonal member to the first joint. The fourth flexure connecting the second diagonal member to the base. The third and fourth flexures are bendable in response to the first joint moving in the first direction to change the second angle with respect to the first direction and thereby move the first and second joints in the second direction.

In the embodiment shown in FIG. 4, force flexure 58 further includes a base 78 and a pair of second diagonal members 82. Second diagonal members 82 are connected to first joint 74 and base 78 at an angle β with respect to +x direction. Base 78 is fixedly mounted to housing 54 as shown in FIG. 3. A pair of third flexures 88 connect corresponding second diagonal members 82 to first joint 74. Similarly, a pair of fourth flexures 90 connect corresponding second diagonal members 82 to base 78. Third and fourth flexures 88 and 90 are bendable as first joint 74 moves in x direction.

Figure 7:
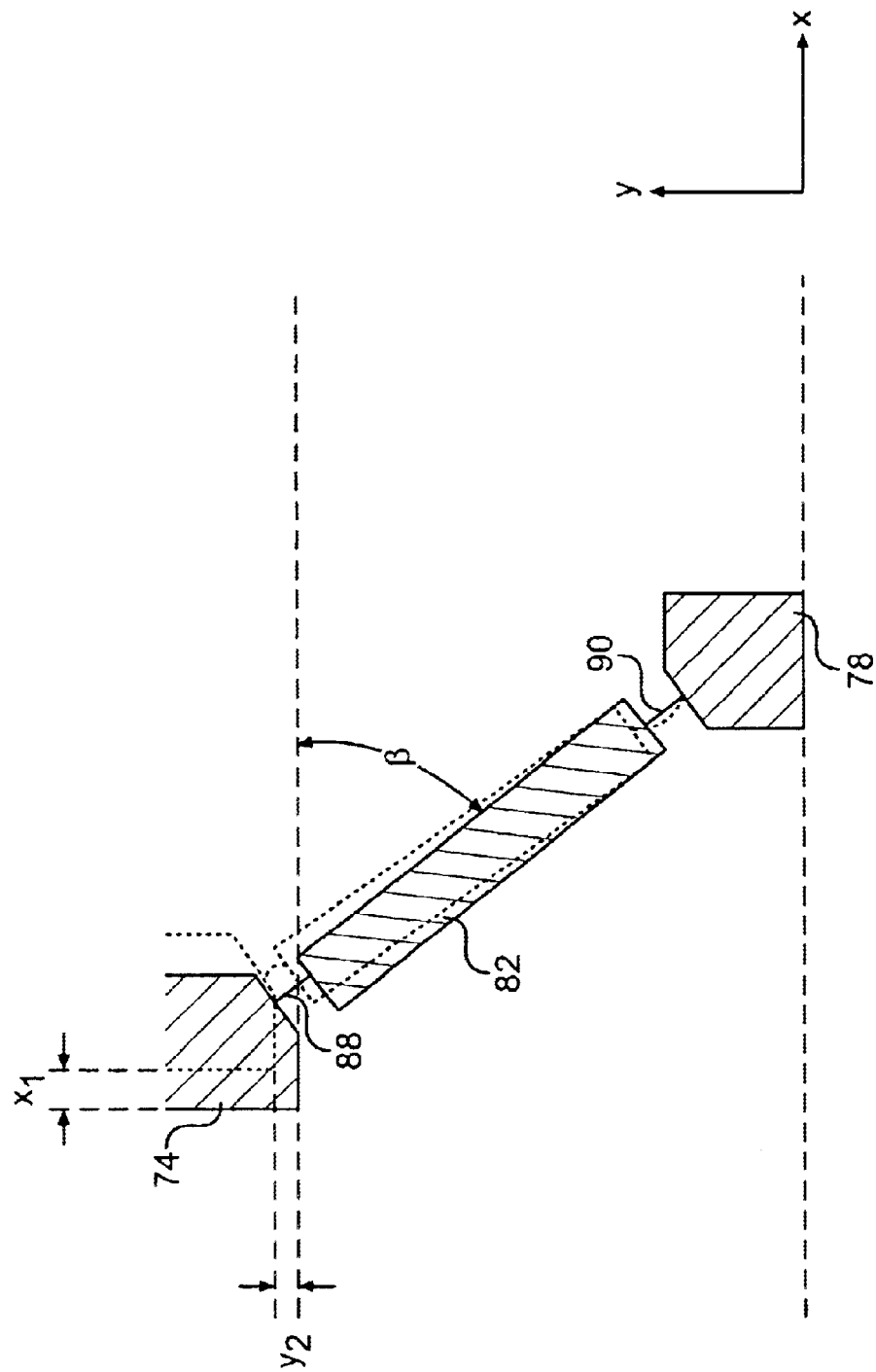
FIG. 7 is a schematic diagram illustrating the movements of a first joint in response to an expanding piezoelectric actuator.
Figure 9:
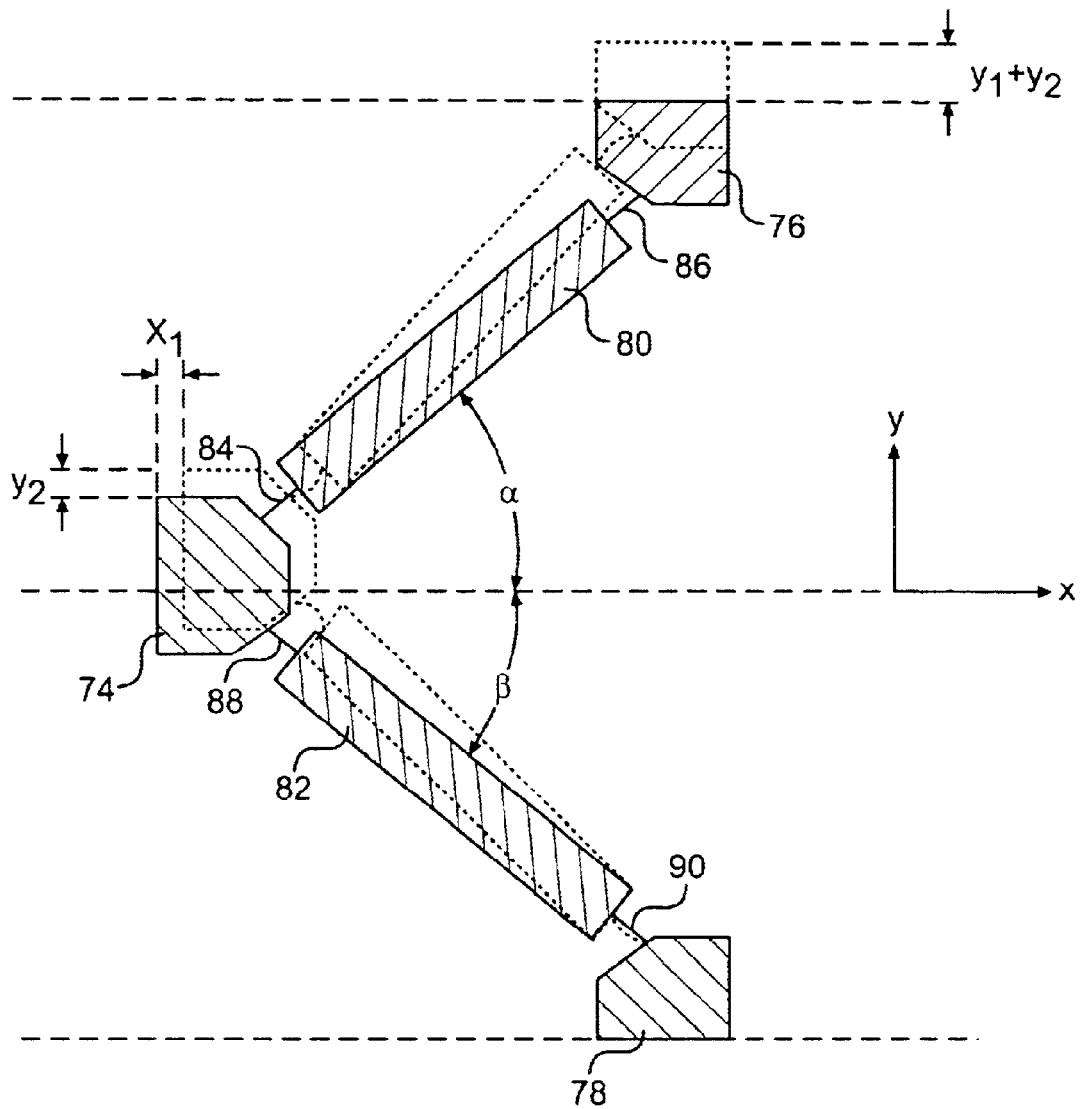
FIG. 9 is a schematic diagram illustrating the movements of a first and second joint in response to an expanding piezoelectric actuator.

As illustrated in FIG. 7, first joint 74 moving in +x direction pushes second diagonal members 82 in +x direction as piezoelectric actuator 56 expands. Second diagonal members 82 as a whole, however, do not move in +x direction because of base 78, which is fixedly mounted to housing 54. Rather, first joint 74 moving in +x direction bends third and fourth flexures 88 and 90 to increase the angle β with respect to +x direction. By bending, fourth flexures 90 also accommodate the rotational movement of second diagonal members 82. Because base 78 is fixedly mounted to housing 54, second diagonal members 82 push off of base 78 and move first joint 74 in +y direction. First diagonal members 80 transmit this movement of first joint 74 in +y direction to second joint 76 and move second joint 76 in +y direction (FIG. 9). As a result, second diagonal members 82 in conjunction with first diagonal members 80 convert the movement of first joint 74 in +x direction by $x_1$ into the movement of first and second joints 74 and 76 in +y direction by $y_2$. FIG. 7 shows only a single second diagonal member 82, a single third flexure 88, and a single fourth flexure 86 to facilitate the understanding of the present invention. Also, FIG. 7 greatly exaggerates the length of third and fourth flexures 84 and 86 in order to show them bending in response to the movement of first joint 74 in +x direction.

Figure 8:
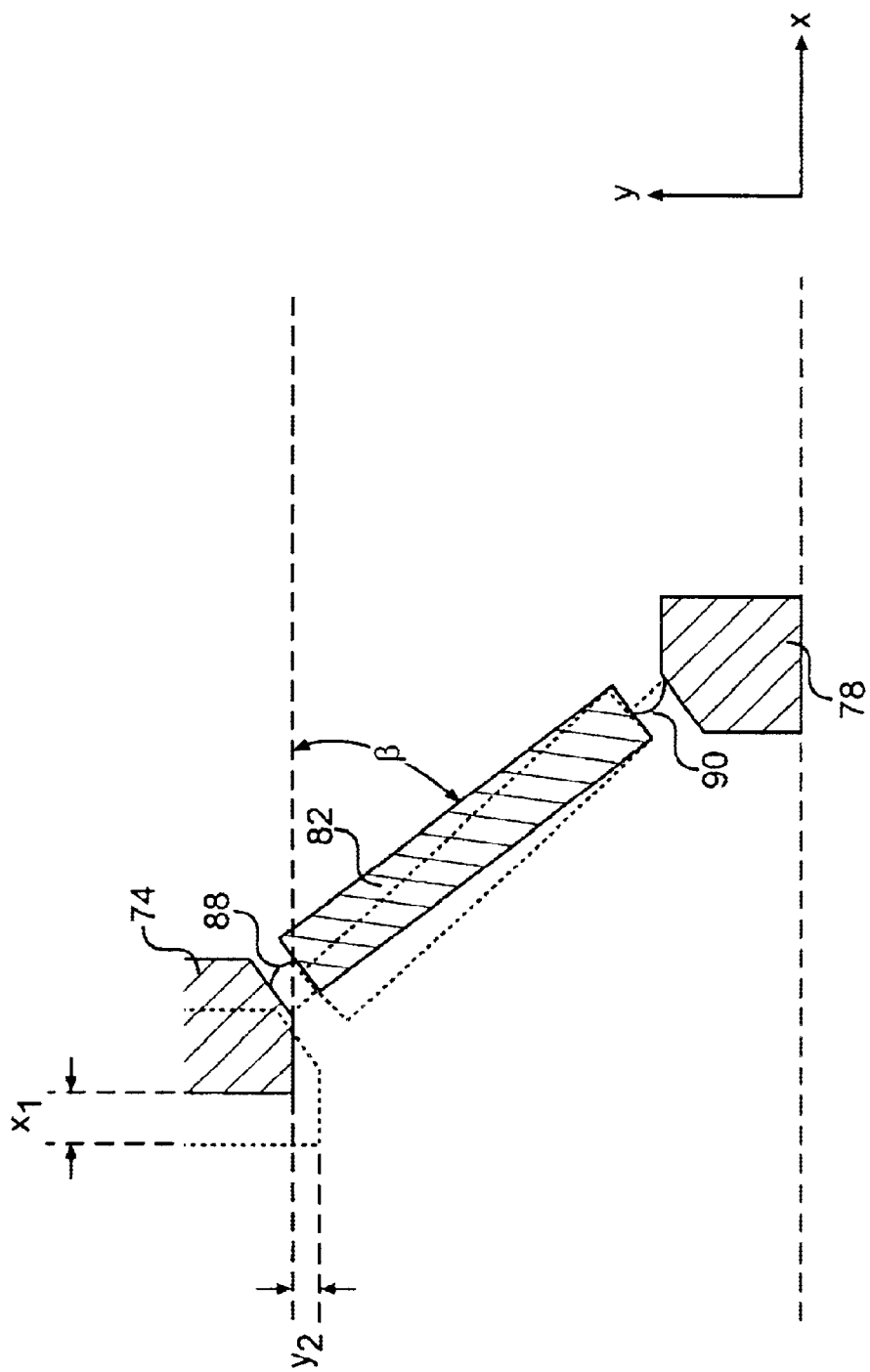
FIG. 8 is a schematic diagram illustrating the movements of a first joint in response to a contracting piezoelectric actuator.
Figure 10:
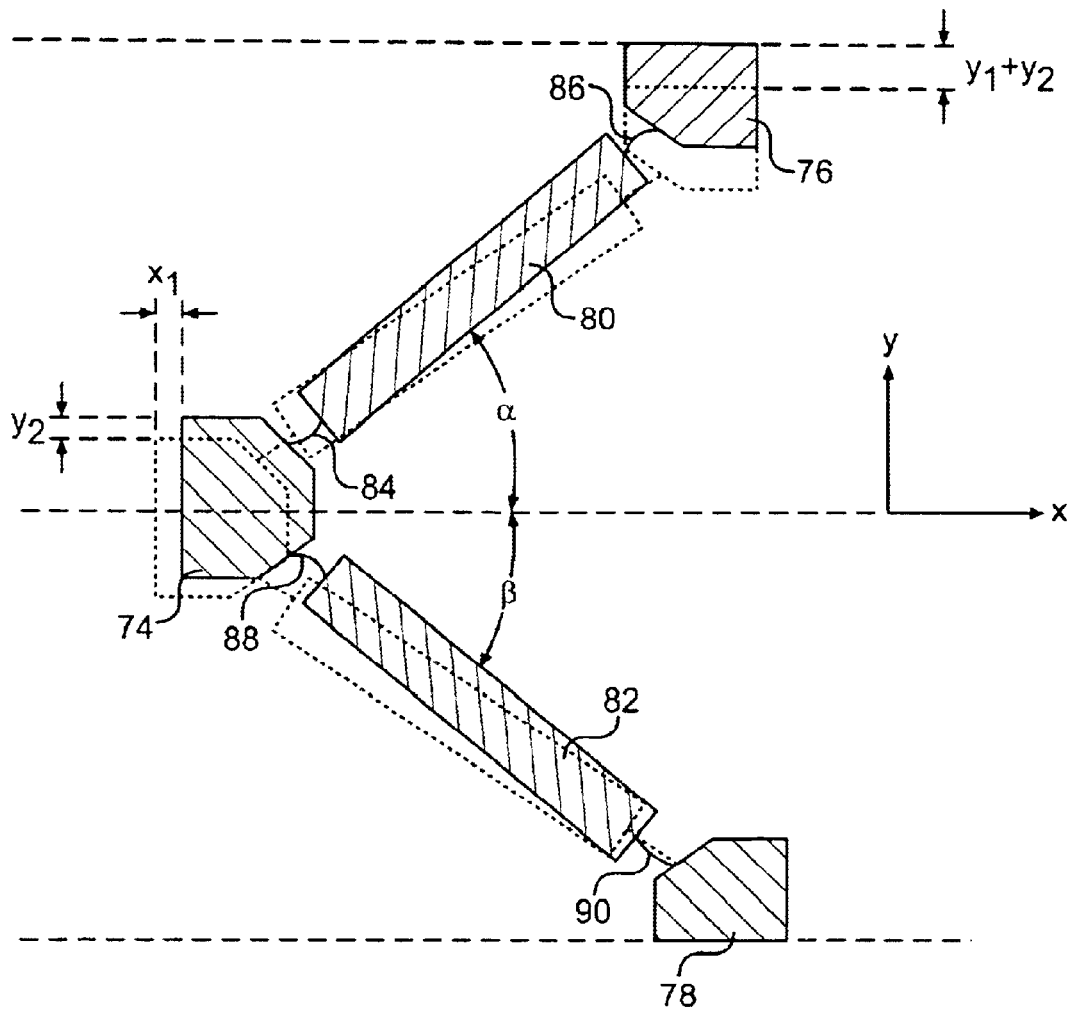
FIG. 10 is a schematic diagram illustrating the movements of a first and second joint in response to a contracting piezoelectric actuator.

Similarly, as illustrated in FIG. 8, first joint 74 moving in −x direction pulls second diagonal members 82 in −x direction as piezoelectric actuator 56 contracts. Second diagonal members 82 as a whole, however, do not move in −x direction because of base 78, which is fixedly mounted to housing 54. Rather, first joint 74 moving in −x direction bends third and fourth flexures 88 and 90 to decrease the angle β with respect to +x direction. By bending, fourth flexures 90 also accommodate the rotational movement of second diagonal members 82. Because base 78 is fixedly mounted to housing 54, second diagonal members 82 pull and move first joint 74 in −y direction. First diagonal members 80 transmit this movement of first joint 74 in −y direction to second joint 76 and move second joint 76 in −y direction (FIG. 10). As a result, second diagonal members 82 in conjunction with first diagonal members 80 convert the movement of first joint 74 in −x direction by $x_1$ into the movement of first and second joints 74 and 76 in −y direction by $y_2$. FIG. 8 shows only a single second diagonal member 82, a single third flexure 88, and a single fourth flexure 86 to facilitate the understanding of the present invention. Also, FIG. 8 greatly exaggerates the length of third and fourth flexures 84 and 86 in order to show them bending in response to the movement of first joint 74 in −x direction.

Although described separately in FIGS. 5 and 7 for ease of understanding, the movements of second joint 76 in +y direction by $y_1$ and $y_2$ combine as first joint 74 moves in +x direction by $x_1$ and in +y direction by $y_2$. In other words, as shown in FIG. 9, second joint 76 moves in +y direction by $y_1+y_2$ when expanding piezoelectric actuator 56 moves first joint 74 in +x direction by $x_1$. Similarly, although described separately in FIGS. 6 and 8 for ease of understanding, the movements of second joint 76 in −y direction by $y_1$ and $y_2$ combine as first joint 74 moves in −x direction by $x_1$ and in −y direction by $y_2$. In other words, as shown in FIG. 10, second joint 76 moves in −y direction by $y_1+y_2$ when contracting piezoelectric actuator 56 moves first joint 74 in −x direction by $x_1$.

For a small change in the angle α, the ratio $y_1/x_1$ (FIGS. 5 and 6) can be approximated as $\cot(\alpha)$. Similarly, for a small change in the angle β, the ratio $y_2/x_1$ (FIGS. 7 and 8) can be approximated as $\cot(\beta)$. Accordingly, the ratio $(y_1+y_2)/x_1$ shown in FIGS. 9 and 10 can by approximated as $\cot(\alpha)+\cot(\beta)$. Therefore, many combinations of the angles α and β could be selected for a desired ratio of $(y_1+y_2)/x_1$. Preferably, the angles α and β are equal and about 45 degrees, resulting in ratio $(y_1+y_2)/x_1 \cong \cot(45)+\cot(45)=2$.

In addition, the changes in the angles α and β in response to expanding or contracting piezoelectric actuator 56 are less than about 1 degree, preferably about 0.5 degrees. Furthermore, piezoelectric actuator 56 preferably expands or contracts less than 100 microns ($x_1$). Therefore, second joint 76 preferably moves less than 200 microns ($y_1+y_2$).

For second joint 76 to move in −y direction as well as +y direction, force flexure 58 applies a preload against piezoelectric actuator 56. Without a preload, force flexure 58 does not respond to contracting piezoelectric actuator 56 although it responds to expanding piezoelectric actuator 56. To apply a preload against piezoelectric actuator 56, force flexure 58 is manufactured with the angles of first and second diagonal members 80 and 82 less than the angles α and β. Then, when mounted to housing 54 and connected to second end 62 of piezoelectric actuator 56, first and third flexures 84 and 88 are bent to the angles α and β. Preferably, the manufactured angles are about 44 degrees and mounted to housing 54 at about 45 degrees. This increase in the mounted angles from the manufactured angles provides the necessary preload against piezoelectric actuator 56.

In accordance with the present invention, the flange of the structure has an axis parallel to the first direction. Also, the structure includes a fifth and sixth flexure. The fifth flexure connects the axial member to the first joint. The sixth flexure connects the axial member to the flange. The fifth and sixth flexures are bendable in response to the first joint moving in the second direction to maintain the axis of the flange parallel to the first direction.

Figure 11:
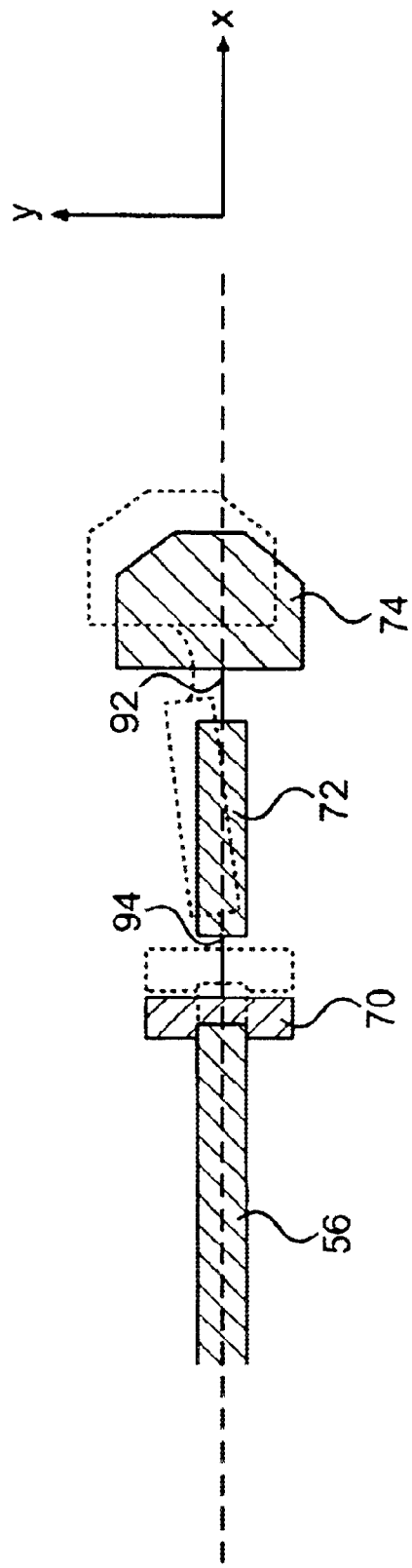
FIG. 11 is a schematic diagram illustrating the movement of an axial member and the bending of a fifth and six flexure in response to an expanding piezoelectric actuator.
Figure 12:
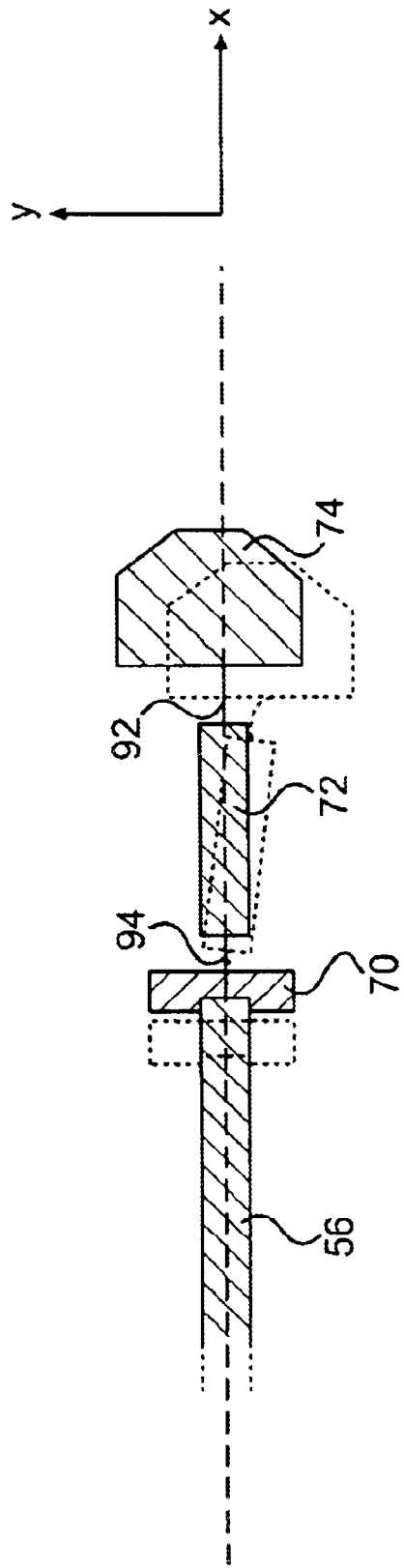
FIG. 12 is a schematic diagram illustrating the movement of an axial member and the bending of a fifth and six flexure in response to a contracting piezoelectric actuator.

In the embodiment shown in FIG. 4, force flexure 58 further includes a fifth flexure 92 and a six flexure respectively connecting axial member 72 to first joint 74 and flange 70. Flange 70 has an axis 73, which is parallel to the x direction. As shown in FIGS. 11 and 12, first joint 74 tilts axial member 72 as it moves in y direction. As it tilts, axial member 72 in turn tries to tilt flange 70 so that axis 73 is not parallel to x direction. As a result, flange 70 tries to apply a bending moment on piezoelectric actuator 56. Fifth and six flexures 92 and 94, however, bend to maintain axis 73 of flange 70 parallel to x direction as first joint 74 moves in y direction. In doing so, fifth and six flexures 92 and 94 prevent flange 70 from applying a bending moment on piezoelectric actuator 56.

Figure 13:
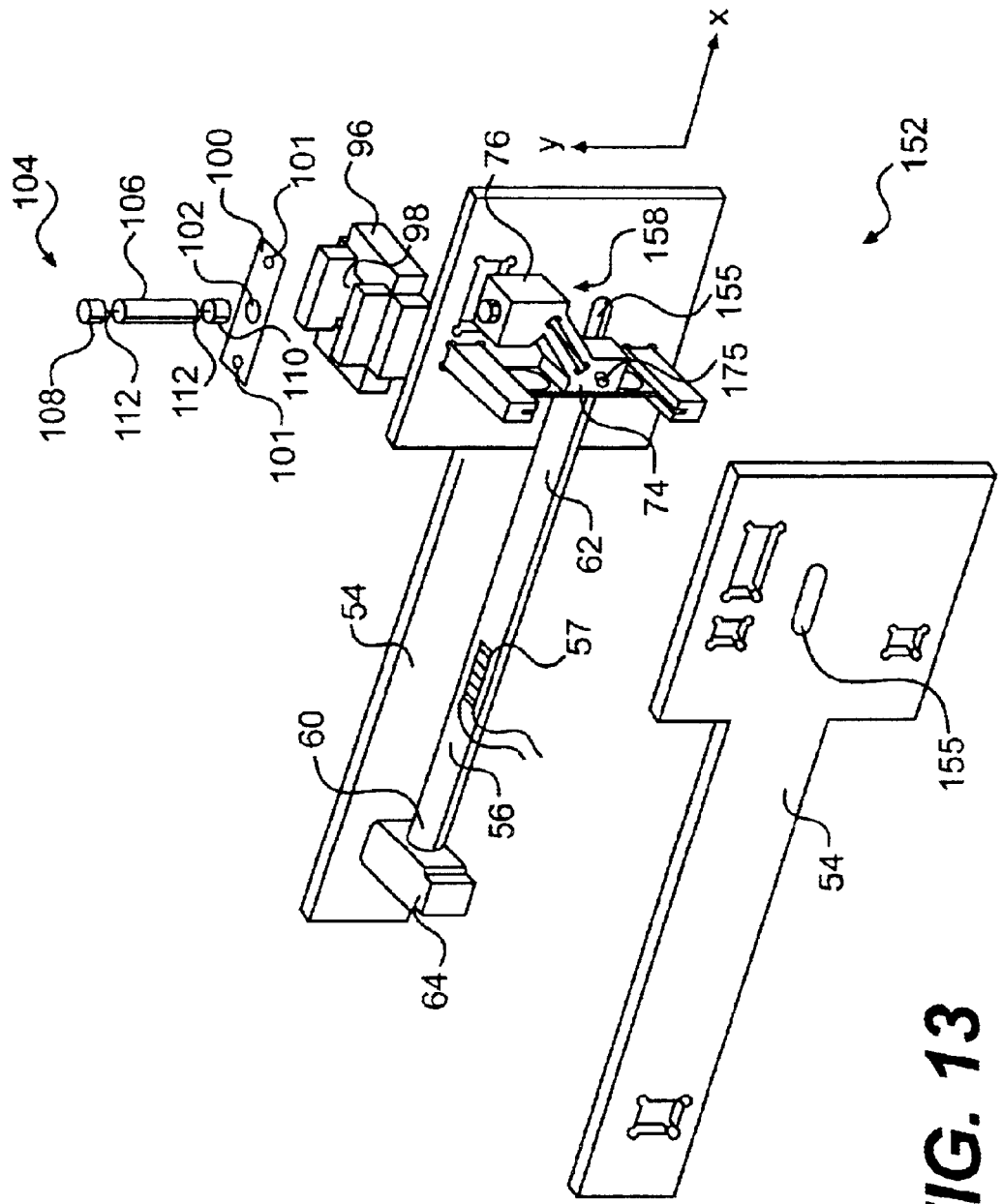
FIG. 13 is an exploded perspective view of an alternative embodiment of the positioning device shown in FIG. 3.
Figure 14:
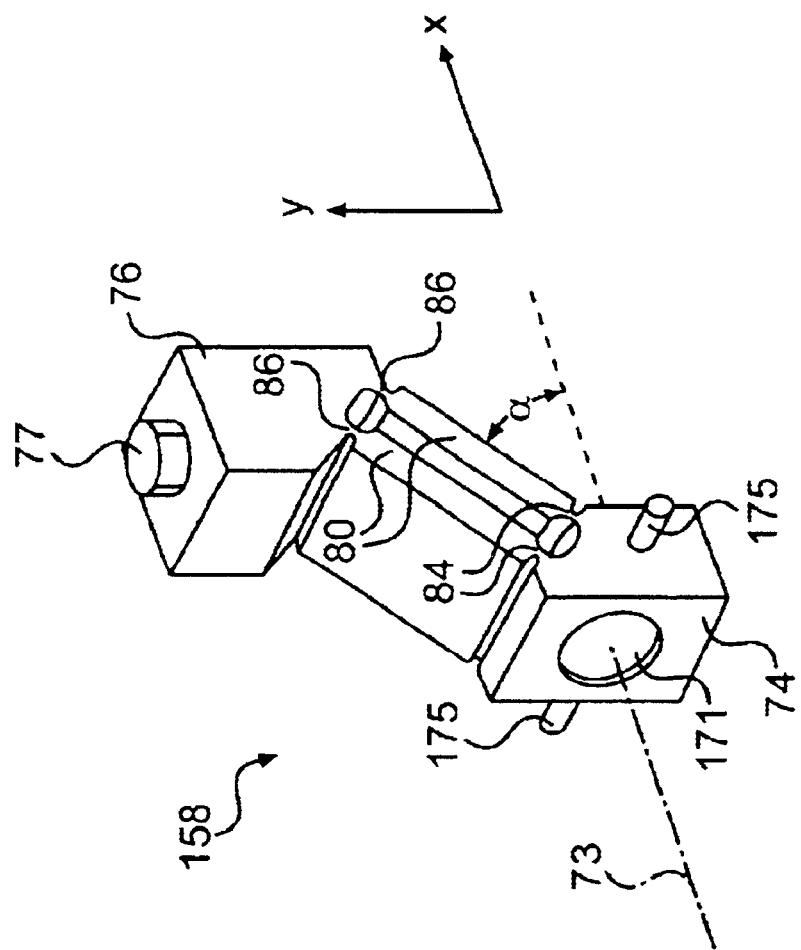
FIG. 14 is a perspective view of an alternative embodiment of the force flexure shown in FIG. 4.

FIG. 13 illustrates an alternative embodiment of a first positioning device while FIG. 14 illustrates an alternative embodiment of a force flexure. They are respectively designated by reference numbers 152 and 158. First positioning device 152 and force flexure 158 are similar to first positioning device 52 and force flexure 58 respectively shown in FIGS. 3 and 4. Accordingly, like parts are designated by the same reference numbers.

Like force flexure 58 shown in FIG. 4, force flexure 158 illustrated in FIG. 14 includes first joint 74, second joint 76, a pair of first diagonal members 80, a pair of first flexures 84, and a pair of second flexures 86. First diagonal members 80 are connected to first joint 74 and second joint 76 at an α with respect to +x direction. Unlike force flexure 58, however, force flexure 158 does not include a pair of second diagonal members 82, base 78, flange 70, or axial member 72. Instead, first joint 74 includes a recess 171 to hold second end 62 of piezoelectric actuator 56. First joint 74 also includes a pair of pins 175 extending from two opposite surfaces of first joint 74. These pins 175 engage corresponding grooves 155 formed in housing 54 (FIG. 13).

Grooves 155 are parallel to x direction and therefore confines the movement of first joint 74 in x direction.

Accordingly, although recess 171 of first joint 74 directly holds second end 62 of piezoelectric actuator 56, first joint 74 does not apply a bending moment on piezoelectric actuator 56. First joint 74 applies no bending moment on piezoelectric actuator 56 because pins 175 and grooves 155 limit its movement only in x direction. Unlike first joint 74 of the embodiment shown in FIGS. 3 and 4, first joint 74 of the embodiment shown in FIGS. 13 and 14 does not move in y direction.

As described earlier, FIGS. 5 and 6 illustrate the movements of first joint 74, first diagonal members 80, and second joint 76 as piezoelectric actuator 56 expands and contracts. Accordingly, the ratio $y_1/x_1$ can be approximated as $\cot(\alpha)$ for a small change in the angles $\alpha$. Therefore, the angles $\alpha$ may vary for a different, desired ratio of $y_1/x_1$. For example, if the desired ratio $y_1/x_1$ is about 2, the angles $\alpha$ is set at about 26.6 degrees ($y_1/x_1 \cong \cot(26.6) \cong 2$). The changes in the angles $\alpha$ in response to expanding or contracting piezoelectric actuator 56 are less than about 1 degree, preferably about 0.5 degrees. Furthermore, piezoelectric actuator 56 preferably expands or contracts less than 100 microns ($x_1$). For the angles $\alpha$ set at about 26.6, this range of motion by piezoelectric actuator 56 moves second joint 76 less than 200 microns ($y_1$).

For second joint 76 to move in −y direction as well as +y direction, force flexure 158 applies a preload against piezoelectric actuator 56. Without a preload, force flexure 158 does not respond to contracting piezoelectric actuator 56 although it responds to expanding piezoelectric actuator 56. To apply a preload against piezoelectric actuator 56, force flexure 158 is manufactured with the angle of first diagonal members 80 less than the angle $\alpha$. Then, when mounted to housing 54 and connected to second end 62 of piezoelectric actuator 56, first flexures 84 are bent to the angle $\alpha$. For example, first diagonal member 80 can be manufactured at an angle of about 25.6 degrees and mounted to housing 54 at about 26.6 degrees ($\alpha$). This increase in the mounted angle from the manufactured angle provides the necessary preload against piezoelectric actuator 56.

As illustrated in FIGS. 3 and 13, first positioning device 52 and 152 further include guide block 96, a guide flexure 100, and a universal flexure 104. As described earlier, guide block 96 is fixedly mounted to housing 54 (FIG. 15) and has opening 98 for second joint 76 to move therethrough. Guide flexure 100 is fixedly mounted to guide block 96 on top of opening 98. Connecting means, such as screws (not shown) or the like, fixedly mount guide flexure 100 to guide block 96 through screw holes 101 or the like. Guide flexure 100 has a hole 102 formed therein and aligned with opening 98 of guide block 96. A projection 77 (FIGS. 4 and 14) formed on top of second joint 76 moves through hole 102 of guide flexure 100.

Universal flexure 104 includes a first end portion 110, a second end portion 108, a mid portion 106, and a pair of flex members 112. First end portion 110 of universal flexure 104 connects to projection 77 formed on top of second joint 76. Any conventional means may be used to connect first end portion 110 and projection 77. For example, male and female threads (not shown) provided respectively on first end portion 110 and on projection 77 may be used to connect them. Similarly, second end portion 108 is connected to wafer table 40 (FIG. 2) by any conventional means, including male and female threads (not shown) provided respectively on second end portion 108 and on a bottom surface of wafer table 40. Flex members 112 connect mid portion 106 to first and second end portions 110 and 108. As universal flexure 104 moves in y direction, wafer table 40 tilts slightly.

Thus, wafer table 40 applies a bending moment on universal flexure 104. Flex members 112, however, bend to absorb and prevent this bending moment from being transmitted to projection 77 of second joint 76.

Figure 16:
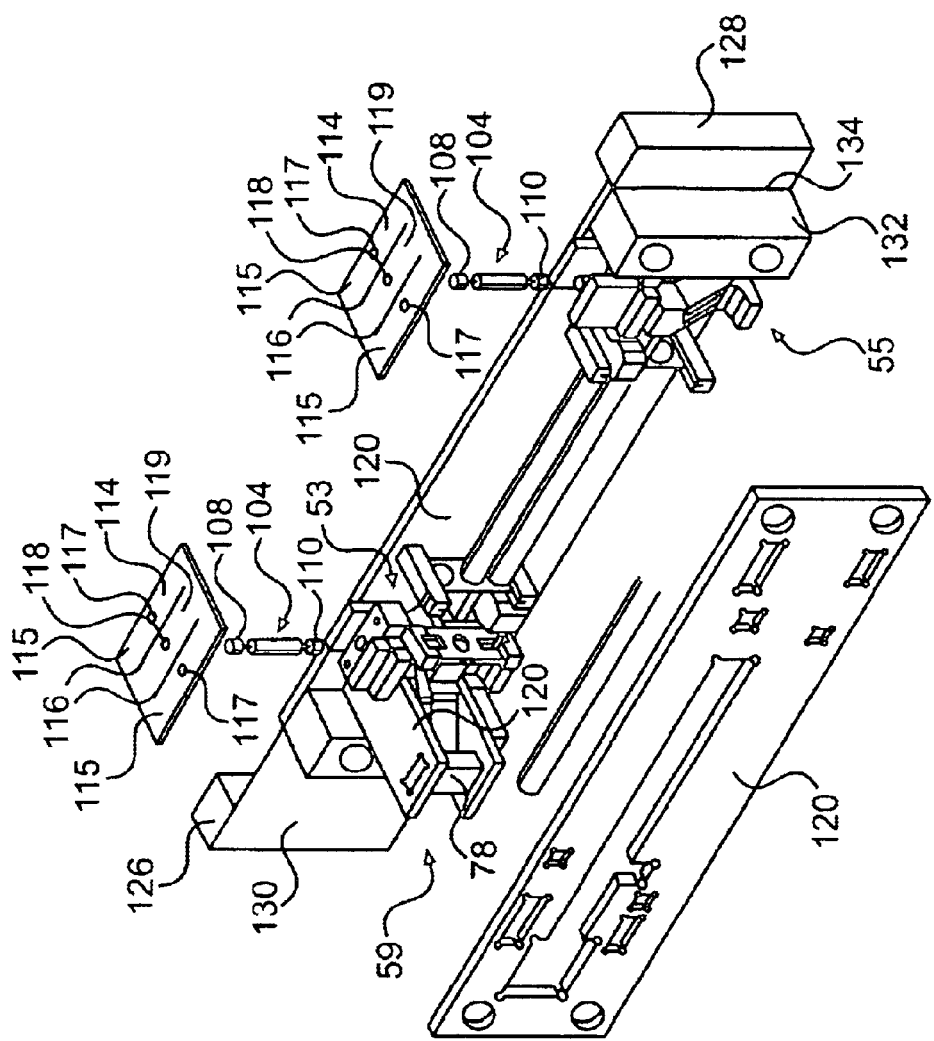
FIG. 16 is an exploded perspective view of three positioning device and their common housing shown in FIG. 2.

As illustrated in FIGS. 2 and 16, second, third, and fourth positioning devices 53, 55, and 59 share a common housing 120. Second and third positioning devices 53 and 55 are similar to first positioning device 52 and 152 except that they both include a flexure strip 114. Flexure strip 114 has a flexing portion 119 formed between a pair of slits 116. Flexure strip 114 also has side portions 115 formed outside flexing portion 119. Flexing portion 119 includes a hole 118. Second end portion 108 of universal flexure 104 passes through hole 118 of flexing portion 119 and connects to wafer table 40 (FIG. 2). Flexure strip 114 is fixedly mounted to common housing 120. Connecting means, such as screws (not shown) or the like, fixedly mount flexure strip 114 to common housing 120 through screw holes 117 or the like.

In addition to second end portion 108 of universal flexure 104 connected to wafer table 40, both flexing portion 119 and side portions 115 of flexure strip 114 support wafer table 40 thereon. Therefore, wafer table 40 is stably supported by three universal flexures 104 and two flexure strips 114 as shown in FIG. 2. Flexing portion 119 bends to accommodate the movement of universal flexure 104.

As shown in FIG. 2, first positioning device 52 is mounted to wafer stage 28 on a first side surface 122 thereof. Second and third positioning devices 53 and 55, which share common housing 120, are mounted to a second side surface 124 of wafer stage 28, opposite to first side surface 122. First, second, and third positioning devices 52, 53, and 55 are arranged such that second joint 76 of each positioning device moves in a single direction. In the coordinate system shown in FIG. 2, this single direction is z direction.

In FIG. 2, the rotational axis of wafer table 40 coincides with universal flexure 104 of third positioning device 55. Thus, first positioning device 52 controls the wafer table 40's rotation around x-axis while second positioning device 53 controls the wafer table 40's rotation around y-axis. In other words, the movement of second joint 76 of first positioning device 52 in z direction rotates wafer table 40 around x-axis while the movement of second joint 76 of second positioning device 53 in z direction rotates wafer table 40 around y-axis. To move wafer table in z direction, second joints 76 of first, second, and third positioning devices 52, 53, and 55 move simultaneously. Of course, any desired movement in z direction combined with any desired rotation around x and y-axes may be achieved by controlling the movements of second joints 76 of first, second, and third positioning devices 52, 53, and 55. Accordingly, first, second, and third positioning devices 52, 53, and 55 in conjunction with wafer stage 28, which is movable in x and y directions, control the position of wafer table 40 in five degrees of freedom (movements in x, y, and z directions and rotations around x and y-axes).

Figure 17:
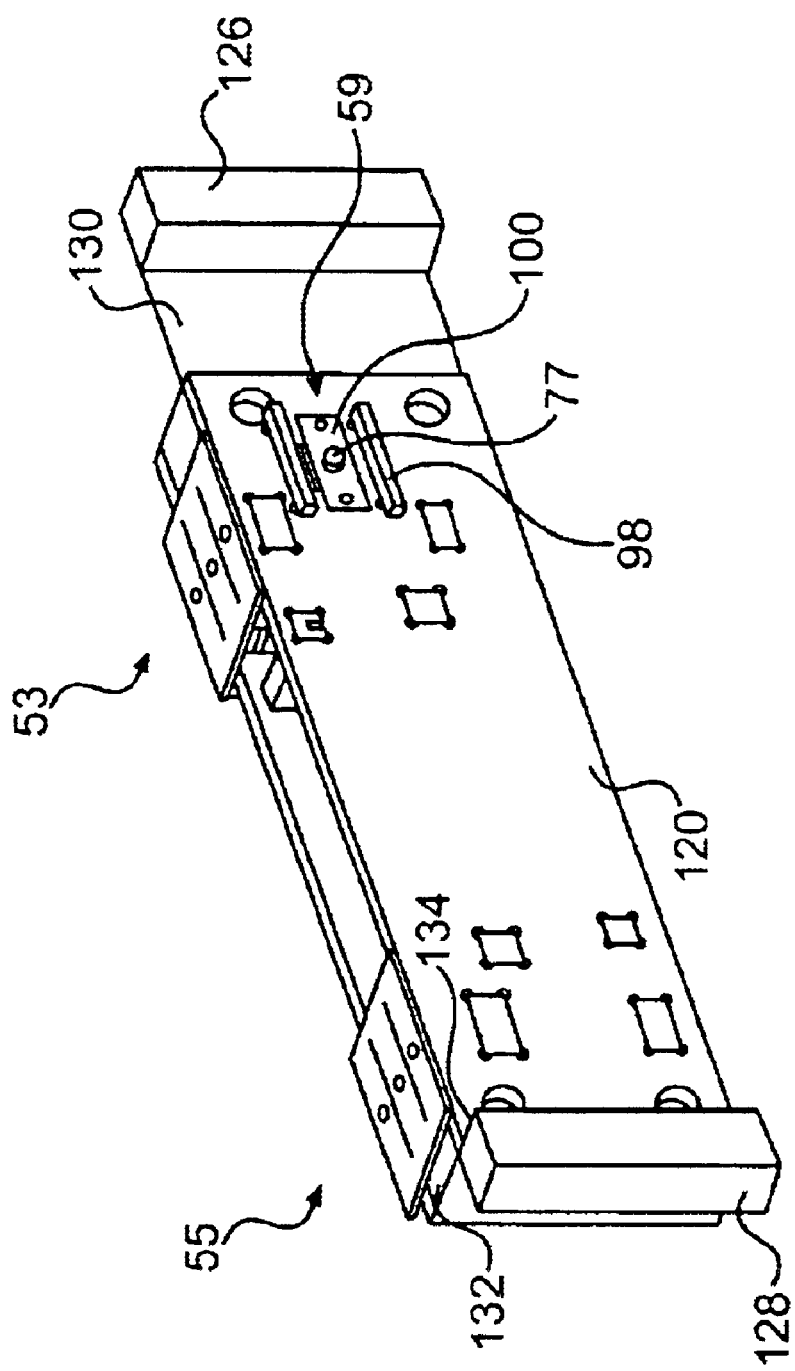
FIG. 17 is a perspective view of three positioning device and their common housing shown in FIG. 2 viewed from another side.

Fourth positioning device 59 shown in FIGS. 2, 16, and 17 controls the wafer table 40's rotation around z axis. Fourth positioning device 59 shares common housing 120 with second and third positioning devices 53 and 55. Fourth positioning device 59, however, is arranged such that its second joint 76 moves, if allowed, in a direction perpendicular to the direction that each second joint 76 of first, second, and third positioning devices 52, 53, and 55 moves. In the coordinate system shown in FIG. 2, second joint 76 of fourth positioning device 59 moves, if allowed, in y direction. As will be explained below, however, second side surface 124 of wafer stage 28 prevents second joint 76 of fourth positioning device 59 from moving in y direction.

As shown in FIGS. 2, 16, and 17, wafer stage 28 includes a first bar 126 and a second bar 128 mounted to second side surface 124 thereof. A flexure plate 130, extending from first bar 126 toward second bar 128, connects to common housing 120. Common housing 120, on the other hand, includes a third bar 132 fixedly mounted thereto. Third bar 132 has an edge connected to second bar 128. This edge serves as a hinge 134 for the rotation of common housing 120 as will be explained below.

As illustrated in FIG. 17, projection 77 formed on second joint 76 of fourth positioning device 59 projects through common housing 120 toward second side surface 124 of wafer stage 28 (FIG. 2). This projection 77 of fourth positioning device 59 abuts against second side surface 124 of wafer stage 28. Alternatively, universal flexure 104 shown in FIG. 3 connected to projection 77 may abut against second side surface 124 of wafer stage 28.

Accordingly, as piezoelectric actuator 56 of fourth positioning device 59 expands or contracts, second joint 76 of fourth positing device 59 attempts to move in y direction in the coordinate system shown in FIG. 2. Second joint 76 of fourth positing device 58, however, does not move in y direction because projection 77 (or universal flexure 104) abuts against second side surface 124 of wafer stage 28. Instead, the amount of force exerted on second side surface 124 of wafer stage 28 by projection 77 (or universal flexure 104) changes as the voltage applied to piezoelectric actuator 56 changes. This change in the amount of force exerted on second side surface 124 of wafer stage 28 is transmitted to base 78 (or first joint 74 if the embodiment shown in FIG. 13 is used). Base 78 (or first joint 74 if the embodiment shown in FIG. 13 is used) then moves in y direction and carries with it common housing 120. As a result, flex plate 130 bends from its initial position and common housing 120 as a whole rotates around hinge 134, which is parallel to z direction in the coordinate system shown in FIG. 2. Universal flexures 104 of second and third positioning devices 53 and 55 transmit this rotation of common housing 120 around hinge 134 to wafer table 40. Accordingly, wafer table 40 rotates around z-axis in the coordinate system shown in FIG. 2.

As described earlier, force flexure 58 and 158 of fourth positioning device 59 applies a preload against piezoelectric actuator 56. Because of this preload applied to piezoelectric actuator 56, the initial position of flex plate 130 is bent away from second side surface 124 of wafer stage 28. This initial position of flex plate 130 allows common housing 120 to rotates clockwise as well as counterclockwise in response to expanding and contracting piezoelectric actuator 56. In other words, flex plate 130 either bends more or bends less from its initially position as piezoelectric actuator 56 expands or contracts.

A number of different types of exposure apparatus 20 may use one or more positioning devices 50 described above to control the position of wafer table 40. For example, exposure apparatus 20 can be used as a scanning type photolithography system which exposes the pattern from reticle 34 onto wafer 38 with both of them moving synchronously. In a scanning type lithographic device, reticle 34 is moved perpendicular to an optical axis of lens assembly 26 by reticle stage 24, and wafer 38 is moved perpendicular to an optical axis of lens assembly 26 by wafer stage 28. Scanning of reticle 34 and wafer 38 occurs while both of them are moving synchronously.

Alternately, exposure apparatus 20 can be a step-and-repeat type photolithography system that exposes reticle 34 while reticle 34 and wafer 38 are stationary. In the step and repeat process, wafer 38 is in a constant position relative to reticle 34 and lens assembly 26 during the exposure of an individual field. Subsequently, between consecutive exposure steps, wafer 38 is consecutively moved by wafer stage 28 perpendicular to the optical axis of lens assembly 26 so that the next field of semiconductor wafer 38 is brought into position relative to lens assembly 26 and reticle 34 for exposure. Following this process, the images on reticle 34 are sequentially exposed onto the fields of wafer 38 so that the next field of semiconductor wafer 34 is brought into position relative to lens assembly 26 and reticle 34.

However, the use of exposure apparatus 20 provided herein is not limited to a photolithography system for a semiconductor manufacturing. Exposure apparatus 20, for example, can be used as an LCD photolithography system that exposes a liquid crystal display device pattern onto a rectangular glass plate or a photolithography system for manufacturing a thin film magnetic head.

Illumination source 30 can be g-line (436 nm), i-line (365 nm), KrF excimer laser (248 nm), ArF excimer laser (193 nm) and $F_2$ laser (157 nm). Alternatively, illumination source 30 can also use charged particle beams such as x-ray and electron beam. For instance, in the case where an electron beam is used, it thermionic emission type lanthanum hexaboride ($LaB_6$) or tantalum (Ta) can be used as an electron gun.

Furthermore, in the case where an electron beam is used, any moving iron (Fe) or magnetic material can affect the magnetic field and thereby affect the target position of the electron beam. Thus, all the movable components of positioning device 50, including force flexure 58 or 158, guide flexure 100, universal flexure 104, and flexure strip 114, are preferably fabricated from a nonmetallic material if an electron beam is used. Among other suitable nonmetallic materials, Zirconia ($ZrO_2$) or Alumina ($Al_2O_3$) ceramics are preferred materials envisioned by the present invention.

With respect to lens assembly 26, when far ultra-violet rays such as the excimer laser is used, glass materials such as quartz and fluorite that transmit far ultra-violet rays is preferably used. When the $F_2$ type laser or x-ray is used, lens assembly 26 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure apparatus that employs vacuum ultra-violet radiation (VUV) of wavelength 200 nm or lower, use of the catadioptric type optical system can be considered. Examples of the catadioptric type of optical system include Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,606 (Application Date: Jun. 12, 1997) also use a reflectingrefracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in an exposure apparatus, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Movement of the stages as described above generates reaction forces which can affect performance of the exposure apparatus. Reaction forces generated by the wafer (substrate) stage motion can be mechanically released to the floor (ground) by use of a frame member as described in U.S. Pat. No. 5,528,118 and published in Japanese Patent Application Disclosure No. 8-166475. Additionally, reaction forces generated by the reticle stage motion can be mechanically released to the floor (ground) by use of a frame member as described in U.S. Pat. No. 5,874,820 and published in Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, an exposure apparatus according to the above described embodiments can be built by assembling various components, including each element listed in the appended claims, in such a manner that prescribed mechanical accuracy, electrical accuracy and optical accuracy are maintained. In order to maintain the various accuracies, prior to and following assembly, every optical component is adjusted to achieve its optical accuracy. Similarly, every mechanical component and every electrical component are adjusted to achieve their respective mechanical and electrical accuracies. The process of assembling each component into an exposure apparatus includes mechanical interfaces, electrical circuit wiring connections and air pressure plumbing connections between each component. Needless to say, there is also a process where each component is assembled prior to assembling an exposure apparatus from the various components. Once an exposure apparatus is assembled using the various components, total adjustment is performed to make sure that every accuracy is maintained in the complete exposure apparatus. Additionally, it is desirable to manufacture an exposure apparatus in a clean room where the temperature and purity are controlled.

Figure 18:
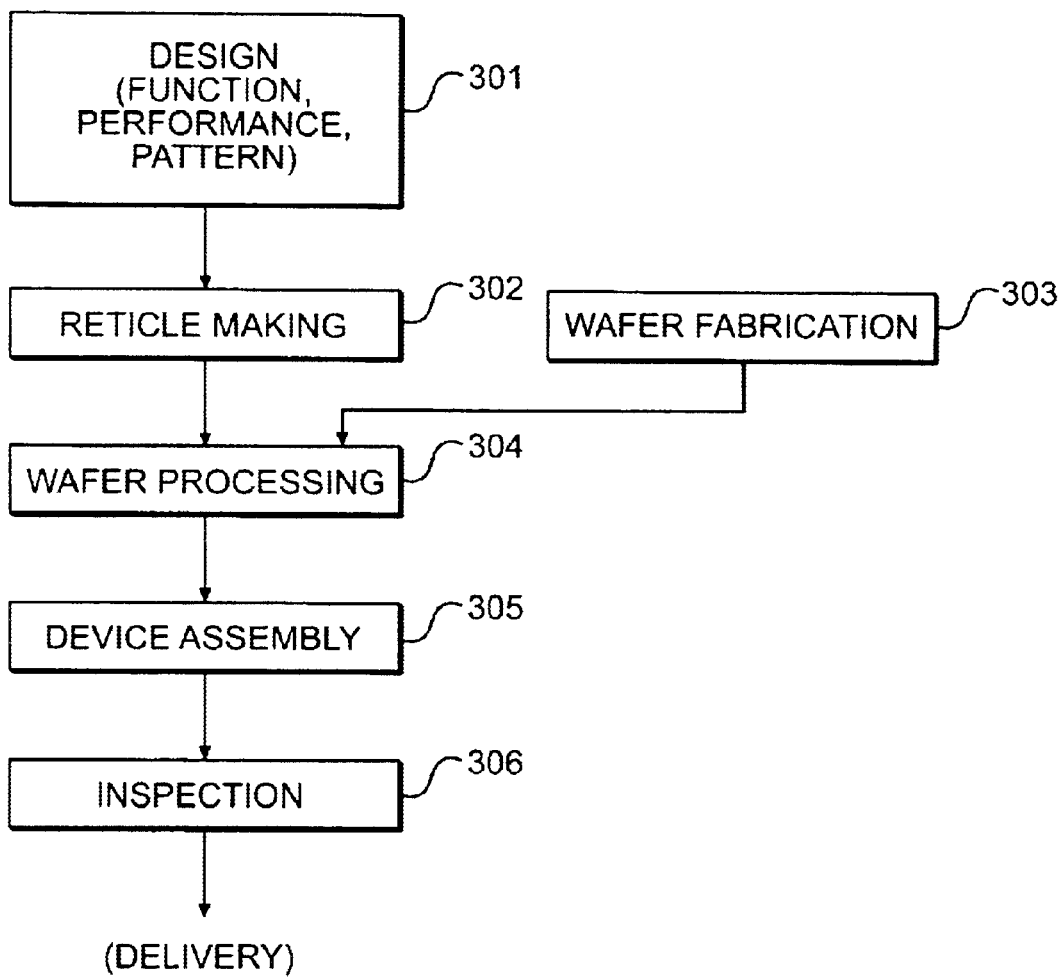
FIG. 18 is a flow chart outlining a process for manufacturing a semiconductor device consistent with the principles of the present invention.

Further, semiconductor devices can be fabricated using the above described exposure apparatus, by the process shown generally in FIG. 18. In step 301 the device's function and performance characteristics are designed. Next, in step 302, a reticle having a pattern is designed according to the previous designing step, and in a parallel step 303, a wafer is made from a silicon material. The reticle pattern designed in step 302 is exposed onto the wafer in step 304 by an exposure apparatus described hereinabove consistent with the principles of the present invention. In step 305 the semiconductor device is assembled (including the dicing process, bonding process and packaging process), then finally the device is inspected in step 306.

Figure 19:
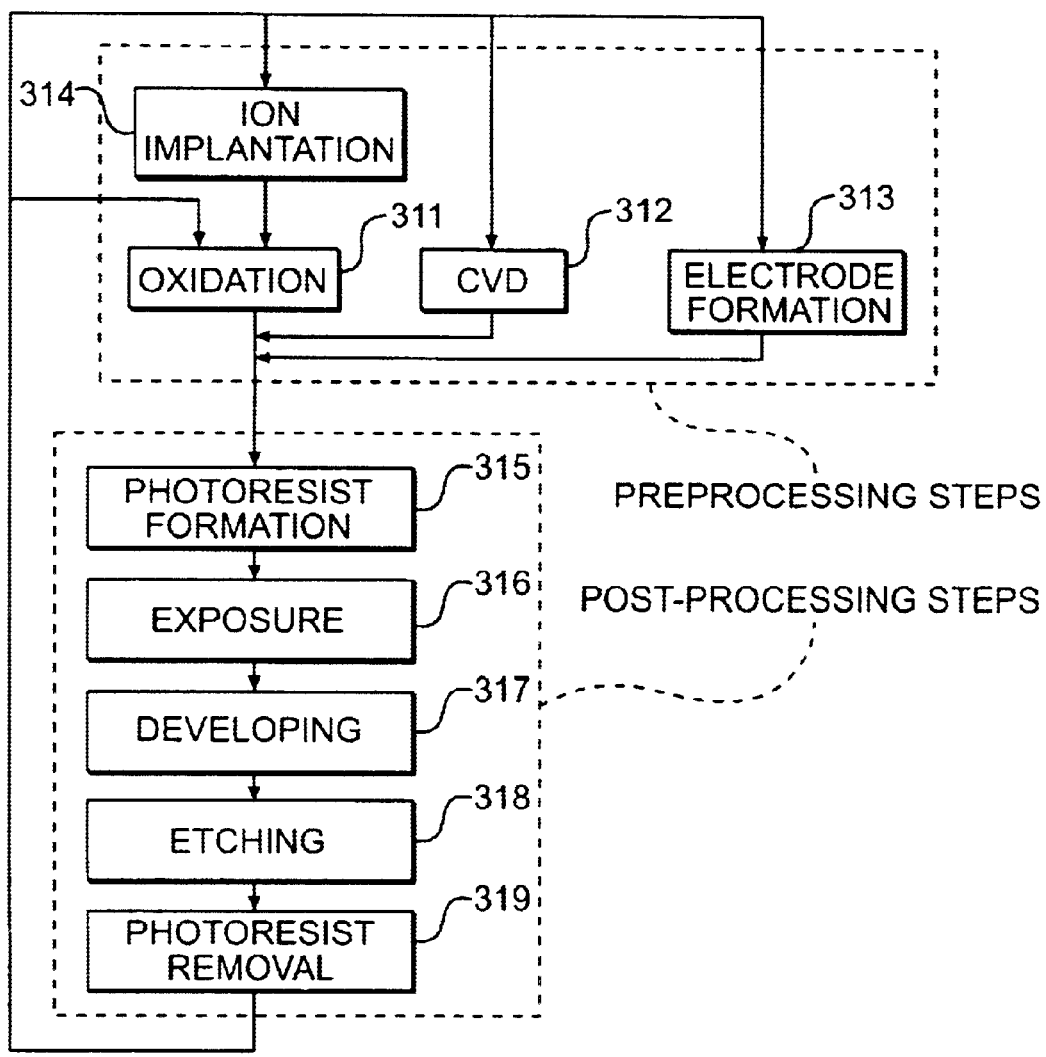
FIG. 19 is a flow chart outlining the process of FIG. 18 in more detail.

FIG. 19 illustrates a detailed flowchart example of the above-mentioned 304 in the case of fabricating semiconductor devices. In step 31 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311 through 314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a reticle to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made to the positioning device and exposure apparatus of the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A structure for moving a wafer table, comprising:
   a first joint movable in a first direction;
   a second joint movable in a second direction to move the wafer table in the second direction;
   a first diagonal member connected to the first and second joints at a first angle with respect to the first direction;
   a first flexure connecting the diagonal member to the first joint;
   a second flexure connecting the diagonal member to the second joint;
   a fixedly mountable base;
   a second diagonal members connected to the first joint and the base at a second angle with respect to the first direction;
   a third flexure connecting the second diagonal member to the first joint; and
   a fourth flexure connecting the second diagonal member to the base,
   wherein the first flexure is bendable in response to the first joint moving in the first direction to change the first angle with respect to the first direction and thereby move the second joint in the second direction,
   wherein the second flexure is bendable in response to the first joint moving in the first direction to maintain the movement of the second joint in the second direction, and
   wherein the third and fourth flexure are bendable in response to the first joint moving in the first direction to change the second angle with respect to the first direction and thereby move the first and second joints in the second direction.

2. The structure of claim 1, further comprising:
- a flange movable in the first direction and having an axis parallel to the first direction;
- an axial member connected to the flange and the first joint;
- a fifth flexure connecting the axial member to the first joint; and
- a sixth flexure connecting the axial member to the flange,
- wherein the fifth and sixth flexures are bendable in response to the first joint moving in the second direction to maintain the axis of the flange parallel to the first direction.

3. The structure of claim 2, wherein the flange includes a recess configured to hold a piezoelectric actuator designed to move the flange in the first direction.

4. The structure of claim 2, wherein a pair of the first diagonal members are connected to the first and second joints.

5. The structure of claim 4, wherein a pair of the second diagonal members are connected to the first joint and the base.

6. The structure of claim 2, wherein the second direction is perpendicular to the first direction.

7. The structure of claim 2, wherein the first and second angles are equal.

8. The structure of claim 2, wherein the first and second angles are less than 45 degrees.

9. The structure of claim 8, wherein the first and second angles change less than 1 degree in response to the first joint moving in the first direction.

10. The structure of claim 2, wherein ratio of the movement of the first joint in the first direction to the movement of the second joint in the second direction is about 1 to 2.

11. The structure of claim 10, wherein the movement of the second joint in the second direction is less than 200 microns.

12. The structure of claim 2, wherein the structure is fabricated from a nonmetallic material.

13. The structure of claim 12, wherein the nonmetallic material is Zirconia ceramic.

14. The structure of claim 12, wherein the nonmetallic material is Alumina ceramic.

* * * * *

UNITED STATES PATENT AND TRADEMARK OFFICE
CERTIFICATE OF CORRECTION

PATENT NO.    : 6,791,669 B2
DATED         : September 14, 2004
INVENTOR(S)   : Poon It is certified that error appears in the above-identified patent and that said Letters Patent is hereby corrected as shown below:

Column 14,
Line 47, "members" should read -- member --.
Line 63, "flexture" should read -- flextures --.

Signed and Sealed this

Fourth Day of January, 2005

JON W. DUDAS
*Director of the United States Patent and Trademark Office*